(12) United States Patent
Wang et al.

(10) Patent No.: US 10,718,807 B2
(45) Date of Patent: Jul. 21, 2020

(54) TEST PROBE AND APPARATUS FOR TESTING PRINTED CIRCUIT BOARD

(71) Applicants: BOE Technology Group Co., Ltd., Beijing (CN); HEFEI XINSHENG OPTOELECTRONICS TECHNOLOGY CO., LTD., Anhui (CN)

(72) Inventors: Kai Wang, Beijing (CN); Chunyang Nie, Beijing (CN); Bingbing Yan, Beijing (CN); Lixin Zhu, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 227 days.

(21) Appl. No.: 15/950,306

(22) Filed: Apr. 11, 2018

(65) Prior Publication Data
US 2019/0011494 A1    Jan. 10, 2019

(30) Foreign Application Priority Data
Jul. 6, 2017  (CN) .................... 2017 2 0814952 U

(51) Int. Cl.
*G01R 31/28*    (2006.01)
*G01R 1/067*    (2006.01)

(52) U.S. Cl.
CPC ...... *G01R 31/2806* (2013.01); *G01R 1/06711* (2013.01); *G01R 1/06788* (2013.01); *G01R 31/2805* (2013.01)

(58) Field of Classification Search
CPC ............ G01R 31/2806; G01R 31/2805; G01R 1/06711; G01R 1/06788
See application file for complete search history.

(56) References Cited

U.S. PATENT DOCUMENTS

| | | | | |
|---|---|---|---|---|
| 5,457,392 A | * | 10/1995 | Filipescu | G01R 1/06788 324/555 |
| 6,340,320 B1 | * | 1/2002 | Ogawa | H01R 13/2421 29/511 |
| 2006/0022690 A1 | * | 2/2006 | Malantonio | G01R 1/07307 438/613 |
| 2007/0229099 A1 | * | 10/2007 | Campbell | G01R 1/06755 324/755.01 |
| 2009/0021276 A1 | * | 1/2009 | Boss | G01R 1/06788 324/755.01 |
| 2012/0084036 A1 | * | 4/2012 | Booman | G01R 1/06766 702/79 |
| 2012/0246371 A1 | * | 9/2012 | Fu | G01R 31/2808 710/301 |
| 2017/0150595 A1 | * | 5/2017 | Lin | H05K 1/0215 |

FOREIGN PATENT DOCUMENTS

EP          0298377 A1 *  1/1989    ......... G01R 1/06783

\* cited by examiner

*Primary Examiner* — Christopher P McAndrew
*Assistant Examiner* — Zannatul Ferdous
(74) *Attorney, Agent, or Firm* — Westman, Champlin & Koehler, P.A.

(57) ABSTRACT

The present disclosure provides a test probe and an apparatus for testing a printed circuit board, wherein the test probe comprises a test pin; and an insulating protection sleeve with adhesive attached therein, wherein the insulating protection sleeve is sleeved on the test pin, and wherein a first end of the test pin protrudes from the insulating protection sleeve.

9 Claims, 2 Drawing Sheets

TEST PROBE AND APPARATUS FOR TESTING PRINTED CIRCUIT BOARD

CROSS-REFERENCE TO RELATED APPLICATION(S)

This application claims priority to the Chinese Patent Application No. 201720814952.6, filed on Jul. 6, 2017, entitled "TEST PROBE AND APPARATUS FOR TESTING PRINTED CIRCUIT BOARD", which is incorporated herein by reference in its entirety.

TECHNICAL FIELD

The embodiments of the present disclosure relate to the field of testing printed circuit boards, and more particularly, to a test probe and an apparatus for testing a printed circuit board.

BACKGROUND

When a Printed Circuit Board (PCB) is tested in a laboratory by bringing a conventional test pin in contact thereon, because a test pad on the PCB has a small size (for example, with a diameter of 0.3 mm), it is difficult to make the test pin and the test pad in contact, and especially when the test is performed for a long time, a failure in the test is easily caused by shaking; when the test is performed on multiple test pads at the same time, it requires a lot of people to work collaboratively; and during the test, there is often a case that because a test pad is far from a ground pad and a ground clamp of a test tool has a wire with a limited length, it causes a clutter interference to a test signal. These factors result in an inefficient test on the PCB.

SUMMARY

In order to at least partially solve or alleviate the above disadvantages, there is provided an apparatus for testing a printed circuit board according to an embodiment of the present disclosure.

In an aspect, there is provided a test probe, comprising: a test pin; and an insulating protection sleeve with adhesive attached therein, wherein the insulating protection sleeve is sleeved on the test pin, and wherein a first end of the test pin protrudes from the insulating protection sleeve.

In some embodiments, a second end of the test pin is an electrical connector.

In another aspect, there is provided an apparatus for testing a printed circuit board, comprising: a test pin; an insulating protection sleeve with adhesive attached therein; and a wire, wherein the insulating protection sleeve is sleeved on the test pin, wherein a first end of the test pin protrudes from the insulating protection sleeve, and wherein a second end of the test pin is connected to a first end of the wire.

In some embodiments, a second end of the wire is connected to a test instrument.

In some embodiments, the apparatus for testing a printed circuit board further comprises: a first test pad, wherein a second end of the wire is connected to the first test pad.

In some embodiments, the area of the first test pad is larger than that of a second test pad on the printed circuit board to be tested.

In some embodiments, the apparatus for testing a printed circuit board further comprises: a ground pad located close to the first test pad.

In some embodiments, the first test pad and the ground pad are located on the same insulating plate.

In some embodiments, the apparatus for testing a printed circuit board further comprises: a test instrument configured to test electrical characteristics of the printed circuit board.

DETAILED DESCRIPTION

In order to enable those skilled in the art to better understand the solutions of the present disclosure, the apparatus for testing a printed circuit board and the test probe according to the embodiments of the present disclosure will be further described in detail below in conjunction with the accompanying drawings and specific embodiments. It will be apparent that the described and illustrated embodiments and various specific features therein are merely illustrative of the present disclosure and do not limit the present disclosure. All other embodiments and specific features thereof obtained by those of ordinary skill in the art based on the exemplary description without any creative work shall fall within the protection scope of the present disclosure.

It should be illustrated that, in the description of the present disclosure, "multiple" means two or more than two unless stated otherwise; and any components or other things may be one or more if a number thereof is not specified. An orientation or positional relationship indicated by the terms "up", "down", "left", "right", "inner", "outer", "front end", "back end", "head", "tail", etc. is an orientation or positional relationship shown based on the accompanying drawings, and is merely used for the convenience of describing the present disclosure and simplifying the description, and does not indicate or imply that the referred apparatus or element must have a specific orientation and be constructed and operated in the specific orientation. Therefore, it cannot be construed as limiting the present disclosure. In addition, the terms "first", "second", etc. are used merely for the purpose of distinguishing from one another, and are not to be construed as indicating or implying a relative order or importance.

It should also be illustrated that, in the description of the present disclosure, the terms "installation", "connection", and "connected" should be interpreted broadly unless specifically regulated and defined otherwise. For example, it may be a fixed connection, a detachable connection or an integral connection; it may be a mechanical connection, an electrical connection, a communication connection, or any combination thereof; it may be a direct connection or an indirect connection through an intermediary medium. Those of ordinary skill in the art can understand the specific meanings of the above terms in the present disclosure according to specific conditions.

Figure 1:
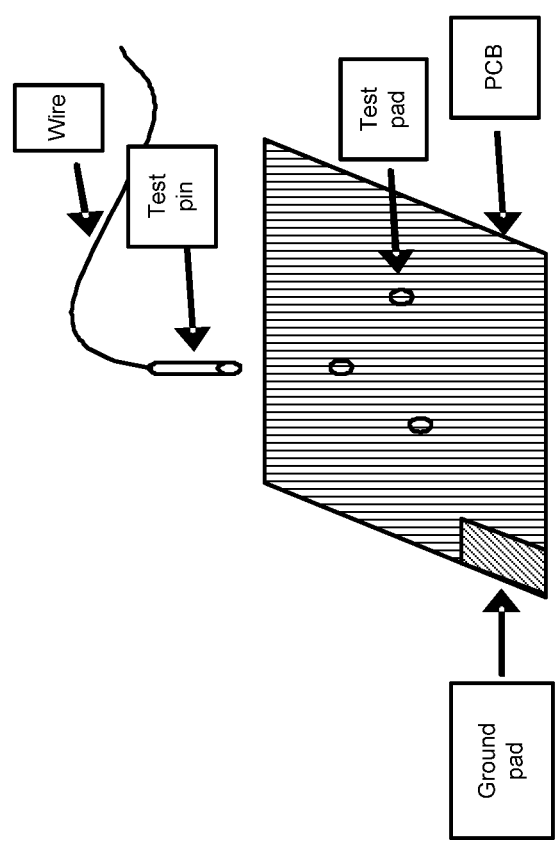
FIG. 1 illustrates a diagram of testing a printed circuit board using a test probe according to the related art.

Referring now to FIG. 1, there is illustrated a diagram of testing a printed circuit board using a test probe in the related art. As shown in FIG. 1, the test probe comprises a test pin and a wire. A second end of the test pin is connected to a first end of the wire, and a second end of the wire may be connected to a test instrument. The test instrument may be any related test instrument, such as an ammeter, a voltmeter, an oscilloscope, etc., which may be used to test electrical characteristics of the printed circuit board. Several test pads (for example, related welding pads or welding spots, etc.) and ground pads (for example, ground welding pads or welding spots, etc.) are provided on the printed circuit board to be tested. During a test, a tester needs to manually press and hold the first end of the test pin on a corresponding test pad, and connect a ground wire of the test instrument to a ground pad on the printed circuit board, and then test the electrical characteristics of the printed circuit board through the test instrument.

When the printed circuit board is tested using this kind of test pin, because the test pad on the printed circuit board has a small size (for example, with a diameter of 0.3 mm), it is inconvenient to make the test pad and the test pin in contact, and when the test is performed for a long time, it needs to manually press the test pin all the time, in which case a test signal is easily lost due to a human jitter; when the test is performed on multiple test pads at the same time, because various test pads have a certain distance from each other and it needs to operate the test instrument, it requires a lot of people to work collaboratively; and during the test, there is often a case that because a test pad is far from a ground pad and a ground clamp of the test instrument has a wire with a limited length, it often causes a clutter interference to a test signal. These factors result in an inefficient test on the printed circuit board.

Figure 2A:
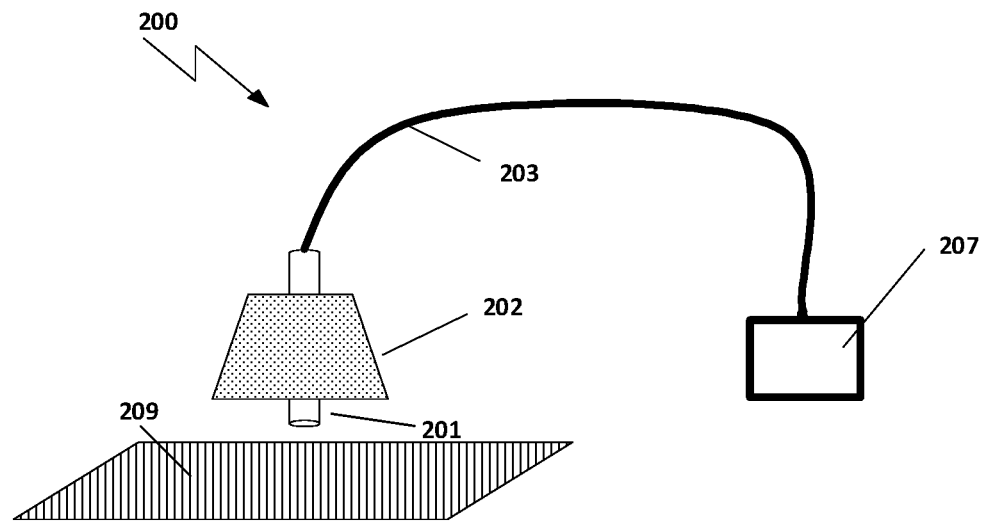
FIGS. 2A and 2B illustrate diagrams of an apparatus for testing a printed circuit board according to embodiments of the present disclosure.

Referring now to FIG. 2A, there is illustrated an apparatus 200 for testing a printed circuit board 209 according to an embodiment of the present disclosure. As shown in FIG. 2, the apparatus 200 for testing a printed circuit board comprises a test pin 201; an insulating protection sleeve 202 with adhesive attached therein; and a wire 203, wherein the insulating protection sleeve 202 is sleeved on the test pin 201, a first end of the test pin 201 protrudes from the insulating protection sleeve 202, and a second end of the test pin 201 is connected to a first end of the wire 203.

The test pin 201 may be any pin-like conductor with a suitable size and may be the same as or similar to a known test pin. The test pin 201 may also be a test pin specific to the present disclosure, for example, it may comprise a middle portion (for example, a middle portion having a threaded or rough surface) adapted to be connected to and fixed with the insulating protection sleeve 202.

The first end of the test pin 201 may be a tip to facilitate precise contact with a test pad on the printed circuit board 209. The second end of the test pin 201 may have an electrical connector so as to be electrically connected to the first end of the wire 203. The electrical connector may have any structure, shape, and size suitable for electrical connection with the wire 203. For example, the electrical connector may simply be a simple end portion of the second end of the test pin 201, and the first end of the wire 203 may comprise a wire clamp, so that the test pin 201 may be electrically connected to the wire 203 by clamping the wire clamp on the simple end portion. As another example, the electrical connector may be a stud or screw hole of the second end of the test pin 201, and the first end of the wire 203 may comprise a matching screw hole or stud, so that the test pin 201 may be electrically connected to the wire 203 through threaded connection. As another example, the electrical connector may be a through hole located at the second end of the test pin 201, so that the test pin 201 may be electrically connected to the wire 203 by passing the first end of the wire 203 through the through hole.

The insulating protection sleeve 202 may be made of any suitable insulating material such as rubber, plastic, wood, etc. The insulating protection sleeve 202 may have any shape for convenience of hand-holding the insulating protection sleeve 202, such as a truncated cone shape shown in FIG. 2.

Figure 3:
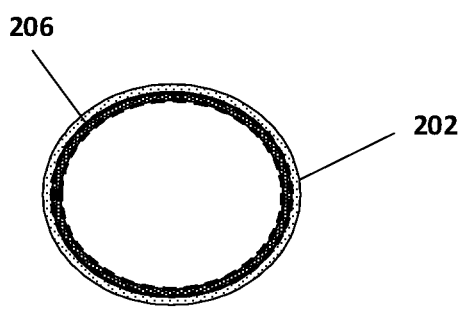
FIG. 3 illustrates a sectional view of a test probe according to an embodiment of the present disclosure.

FIG. 3 illustrates a schematic sectional view of the insulating protection sleeve 202 according to an embodiment of the present disclosure. As shown in FIG. 3, the insulating protection sleeve 202 comprises adhesive 206 therein. As shown in FIG. 3, the adhesive 206 may be attached to an inner surface of the insulating protection sleeve 202 to form an adhesive layer. Of course, the adhesive 206 may also fill up the interior of the insulating protection sleeve 202. The adhesive 206 may be any type of adhesive which may be adhered to a welding pad on the printed circuit board 209.

Since the insulating protection sleeve 202 comprises the adhesive 206 therein, the adhesive 206 may be adhered to a test pad on the printed circuit board 209 by pressing the insulating protection sleeve 202, so that the first end of the test pin is fixed on the test pad of the printed circuit board 209 without manually maintaining the stability of the test pin. Thereby, it is more convenient, faster, more accurate and more reliable to perform a test; and it is suitable to perform a test on multiple test pads at the same time, which saves manpower and improves the test efficiency.

In some embodiments, the adhesive 206 has moderate viscosity and may be conveniently detached from a welding pad after being adhered to the welding pad. Therefore, the adhesive 206 may be used repeatedly.

In some embodiments, a second end of the wire 203 may be connected to a test instrument, for example, a test instrument 207 shown in FIG. 2A. For example, the wire 203 may be a wire which comes with the test instrument 207, or may also be a separate wire. The test instrument 207 may be any related test instrument, such as an ammeter, a voltmeter, an oscilloscope, etc., which may be used to test electrical characteristics of the printed circuit board 209.

During a test, the test pin 201 may be placed on a test pad of the printed circuit board to be tested 209, and the insulating protective cover 202 is lightly pressed, so that the adhesive 206 in the insulating protection sleeve 202 is adhered to the test pad of the printed circuit board 209 and the test pin 201 is fixed. Thereby, the related electrical characteristics of the printed circuit board 209 can be tested using the test instrument 207.

Figure 2B:
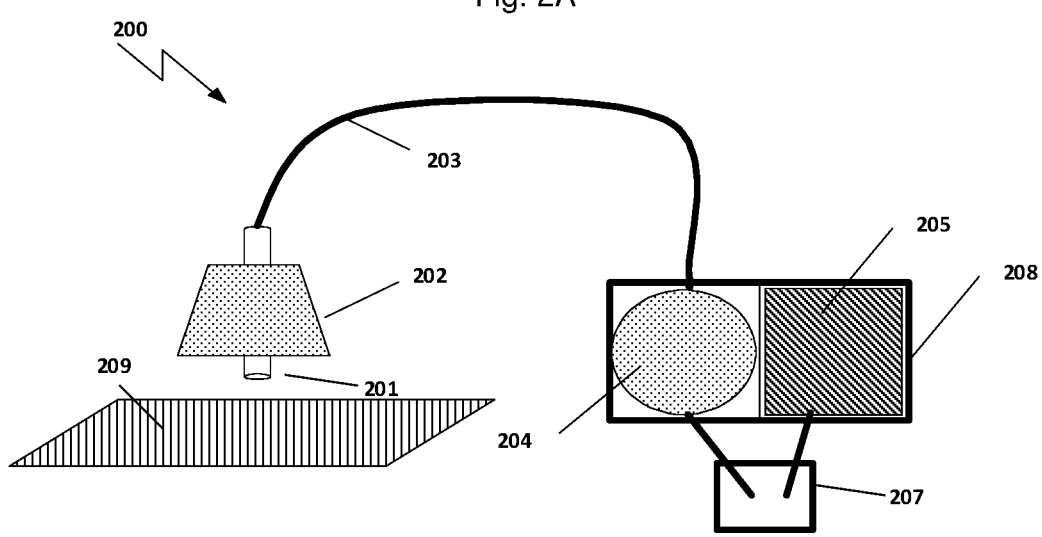

In some other embodiments, as shown in FIG. 2B, the apparatus 200 for testing a printed circuit board further comprises a first test pad 204, wherein the second end of the wire 203 is connected to the first test pad 204. The first test pad 204 may be any conductor, for example, a welding pad. That is, in these embodiments, the wire 203 is not directly connected to the test instrument 207 but is firstly connected to the first test pad 204. The test instrument 207 may be connected to the first test pad 204 using a test tool such as a probe, a clamp, etc., so as to test the printed circuit board 209, thereby expanding the applicable scope and applicable occasion of the apparatus 200 for testing a printed circuit board, and further effectively improving the convenience and accuracy of the test operation of the printed circuit board 209.

In a further embodiment, the area of the first test pad 204 is larger than that of a second test pad on the printed circuit board 209. In this way, compared with being directly connected to the second test pad on the printed circuit board 209 using a tool such as a probe etc., it is more convenient to be connected to the first test pad 204 with a larger area using a tool such as a probe etc., thereby further improving the convenience and accuracy of the test.

In a further embodiment, the apparatus 200 for testing a printed circuit board further comprises a ground pad 205 located close to the first test pad 204. That is, the ground pad 205 and the first test pad 204 may be as close as possible, but there is a sufficient gap therebetween to maintain electrical isolation. For example, a distance between the ground pad 205 and the first test pad 204 may be 0.1 cm to 5 cm. The ground pad 205 may be any ground conductor, such as a ground welding pad. In this way, a ground wire of the test instrument 207 may be connected to the ground pad 205 nearby to filter out a clutter interference without being connected to the ground pad on the printed circuit board 209 to be tested. Thereby, it is more beneficial to perform a test on multiple pads.

In a further embodiment, the first test pad 204 and the ground pad 205 are located on the same insulating plate 208. The insulating plate 208 may have any size and structure which facilitate placement of the first test pad 204 and the ground pad 205 and may be made of any insulating material. In this way, a structure of the entire apparatus can be made more compact and it is more convenient to perform a test operation.

In some embodiments, the apparatus 200 for testing a printed circuit board 209 further comprises a test instrument 207 configured to test electrical characteristics of the printed circuit board 209. The test instrument 207 may be any related test instrument, such as an ammeter, a voltmeter, an oscilloscope, etc., which may be used to test the electrical characteristics of the printed circuit board 209. The test instrument 207 may comprise the wire 203 or may be connected to the wire 203, so that the test instrument 207 may be connected to the test pad on the printed circuit board 209 via the test pin 201 to test the printed circuit board 209. Alternatively, the test instrument 207 may be connected to the first test pad 204 via another wire or tool, so that the test instrument 207 may be connected to the test pad on the printed circuit board 209 via the wire 203 connected to the first test pad 204 and the test pin 201 to test the printed circuit board 209.

It can be seen that the test probe and the apparatus for testing a printed circuit board according to the embodiments of the present disclosure can conveniently fix the test pin on the test pad of the printed circuit board without manually maintaining the stability of the test pin. Thereby, it is more convenient, faster, more accurate and more reliable to perform a test; and it is suitable to perform a test on multiple test pads at the same time, which saves manpower and improves the test efficiency.

The apparatus for testing a printed circuit board according to the embodiments of the present disclosure has been described above with reference to the accompanying drawings. It should be illustrated that the above description and illustrations are only examples and do not limit the present disclosure. In other embodiments of the present disclosure, the apparatus for testing a printed circuit board may comprise more, fewer, or different components, and relationships such as connections, inclusions, functions, etc. among the components may be different from those described and illustrated.

In another aspect of the present disclosure, there is further provided a test probe according to an embodiment of the present disclosure, comprising: a test pin; and an insulating protection sleeve with adhesive attached therein; wherein the insulating protection sleeve is sleeved on the test pin, and a first end of the test pin protrudes from the insulating protection sleeve. The test pin may be the same as or similar to the test pin 201 described above, and the insulating protection sleeve may be the same as or similar to the insulating protection sleeve 202 described above. That is, the test probe only comprises the test pin 201 and the insulating protection sleeve 202 in the apparatus 200 for testing a printed circuit board according to the embodiment of the present disclosure described above, but does not comprise the wire 203.

In a further embodiment, a second end of the test pin is an electrical connector and may protrude from the insulating protection sleeve. In this way, during a test, the test pin may be connected to a wire of a test instrument via the electrical connector, and may be adhered to a test pad on the printed circuit board via the adhesive in the insulating protection sleeve, so as to test the printed circuit board. The electrical connector may have any structure, shape, and size suitable for electrical connection with the wire, as described in detail above.

The test probe according to the embodiment of the present disclosure has been described above, and it should be illustrated that the above description is only an example and does not limit the present disclosure. In other embodiments of the present disclosure, the test probe may have different structures, and may comprise more, fewer, or different components, and relationships such as connections, inclusions, and functions etc. among the components may be different from those described and illustrated.

It can be understood that the above embodiments of the present disclosure are merely exemplary embodiments for illustrating the principle of the present disclosure, and the present disclosure is not limited thereto. For those of ordinary skill in the art, various variations and improvements can be made without departing from the spirit and essence of the present disclosure, and these variations and improvements are also considered to fall within the protection scope of the present disclosure. The protection scope of the present disclosure is limited only by the language meaning of the appended claims and their equivalents.

We claim:

1. A test probe, comprising:
   a test pin; and
   an insulating protection sleeve with adhesive attached therein,
   wherein the insulating protection sleeve is sleeved on the test pin, and
   wherein a first end of the test pin protrudes from the insulating protection sleeve,
   wherein the insulating protection sleeve is operative to be pressed against a printed circuit board to be tested such that the adhesive is adhered to a test pad on the printed circuit board.

2. The test probe according to claim 1, wherein a second end of the test pin is an electrical connector.

3. An apparatus for testing a printed circuit board, comprising:
   a test pin;
   an insulating protection sleeve with adhesive attached therein; and
   a wire,
   wherein the insulating protection sleeve is sleeved on the test pin, and is operative to be pressed against the printed circuit board such that the adhesive is adhered to a test pad on the printed circuit board,
   wherein a first end of the test pin protrudes from the insulating protection sleeve, and wherein a second end of the test pin is connected to a first end of the wire.

4. The apparatus according to claim 3, wherein a second end of the wire is connected to a test instrument.

5. The apparatus according to claim 3, further comprising:
a first test pad,
wherein a second end of the wire is connected to the first test pad.

6. The apparatus according to claim 5, wherein an area of the first test pad is larger than that of a second test pad on the printed circuit board to be tested.

7. The apparatus according to claim 5, further comprising:
a ground pad located close to the first test pad.

8. The apparatus according to claim 7, wherein the first test pad and the ground pad are located on a same insulating plate.

9. The apparatus according to claim 4, further comprising:
a test instrument configured to test electrical characteristics of the printed circuit board.

* * * * *